United States Patent [19]

Burov et al.

[11] 4,024,030

[45] May 17, 1977

[54] RADIATION SENSITIVE ELEMENTS AND PHOTOGRAPHIC PROCESSES USING THE SAME

[75] Inventors: Atanas Tzvetanov Burov; Penka Atanasova Simidjieva; Rumyana Toteva Stoicheva; Jordan Petrov Malinovski, all of Sofia, Bulgaria

[73] Assignee: Institute po Phisikohimia pri Bulgarska Akademia na Naukite, Sofia, Bulgaria

[22] Filed: Oct. 29, 1974

[21] Appl. No.: 518,972

Related U.S. Application Data

[63] Continuation-in-part of Ser. No. 271,406, July 13, 1972, abandoned.

[30] Foreign Application Priority Data

July 30, 1971 Bulgaria ................................. 18203

[52] U.S. Cl. ................................. 204/15; 204/38 B; 96/48 PD; 96/48 R; 96/36; 96/38.4; 96/67; 96/76 R; 96/85; 96/87 R; 96/1.5
[51] Int. Cl.² ...................... G03C 5/24; G03C 5/00; G03C 1/76
[58] Field of Search ............... 96/67, 76 R, 85, 1.5, 96/87 R, 48 R, 48 PD; 204/15, 38 B; 427/296, 322

[56] References Cited

UNITED STATES PATENTS 3,600,330   1/1967   Schneble et al. .................. 96/87 R Primary Examiner—Won H. Louie, Jr.
Attorney, Agent, or Firm—Larson, Taylor and Hinds

[57] ABSTRACT

Process for preparing photographic materials yielding on imagewise exposure to radiation a direct positive image is provided, which comprises the deposition of a thin layer of catalytically active metal onto a carrier base on the surface of which has been deposited an intermediate adhesive layer or surface filled by the deposition thereon and in direct contact therewith of a second thin layer of a photosensitive inorganic compound capable of reacting catalytically with the metal layer when activated upon exposure to radiation, so that the metal layer is destroyed on the illuminated areas but remains intact on the nonilluminated areas of the photographic material, creating in this way a direct positive metal image, capable of being stabilized and intensified.

2 Claims, No Drawings

RADIATION SENSITIVE ELEMENTS AND PHOTOGRAPHIC PROCESSES USING THE SAME

This application is a continuation-in-part of prior U.S. application Ser. No. 271,406 filed July 13, 1972, now abandoned This invention relates to photographic materials which upon imagewise exposure to radiation yield a direct positive image and to a process for preparing such materials.

Most of the common and well known photographic materials yield on illumination a negative image consisting of metal nuclei formed in the illuminated areas. The efficiency of these known photographic materials depends on the ability of the photosensitive compounds used to form on exposure metal nuclei capable of catalysing, on proper treatment, the selective deposition of an additional quantity of a metal onto themselves. Silver halides, which are present in many conventional photographic materials, have the most outstanding properties in this respect. All other photosensitive compounds have a significantly lower ability to form catalytically active metal nuclei, due to which the "speed" of the photographic materials prepared with them is undesirably low.

British patent specification No. 1,151,310 describes and claims a process for preparing a photographic material capable of yielding on imagewise exposure to radiation a direct positive developable image, which comprises depositing onto a carrier base a layer of at least one photosensitive substance other than a silver halide, and then depositing thereon and in direct contact therewith a layer of a metal, which layer is sufficiently thin to allow the passage of radiation therethrough, the metal being capable of reacting chemically with the photosensitive substance when the latter is activated upon exposure to radiation.

The metal nuclei, preliminary deposited, preferably by vacuum evaporation, on the surface of the photosensitive substance, are destroyed during irradiation as a result of a photochemical reaction occuring on exposure to activating irradiation. Thus the photosensitive layer is intentionally fogged by means of the thin metal layer. As mentioned above, the photosensitive layer decomposes on irradiation and the metal deposited on it reacts chemically with the products of the photolysis, whereby the material in the exposed areas cannot be developed. On development only those areas which have not been irradiated become black, i.e. a direct positive image is formed. The application of these known photographic materials is limited, however, by the fact that the photosensitive layer remains between the carrier and the image formed, thus impeding the stabilisation of the image obtained against mechanical and radiation influences. The applicability of these known photographic materials is further limited by the need to apply aqueous solutions to them to develop the positive image, which makes it particularly difficult to use water soluble photosensitive substances.

It is an object of the present invention to provide new photographic materials, which form upon irradiation a direct positive metal image firmly fixed to a suitable carrier, which image can be intensified by the additional deposition of the same or another metal.

According to one aspect of the present invention there is provided a photographic material capable of yielding on imagewise exposure to radiation a direct positive image, which material comprises a carrier base, an intermediate layer of adhesive material or an adhesive surface, a layer of at least one metal carried by the carrier base, and a layer of at least one photosensitive compound in intimate contact with the metallic layer, wherein the photosensitive compound(s) is/are capable when activated upon exposure to radiation of reacting chemically with the metallic layer in a manner such that in any region exposed to radiation the metallic layer is destroyed but in any region not so exposed the metallic layer remains intact thereby forming an image capable of being stabilized and intensified.

Another aspect of the present invention provides a process for preparing the photographic material, which comprises depositing onto a carrier base having an intermediate adhesive layer or surface at least one metal in a layer, depositing on said metallic layer and in intimate contact therewith a layer of at least one photosensitive compound capable when activated upon exposure to radiation of reacting with the metallic layer in a manner such that the catalytic activity of metallic layer is destroyed in radiated regions of the photographic material but remains intact in the radiation-free regions of the photographic materials.

The photographic materials of the present invention comprise a carrier substrate covered by a thin metal layer on which is a thin layer of an appropriate photosensitive substance.

The thin metal layer is attached to the substrate by means of an intermediate adhesive layer or surface which assures the necessary adhesion between the metal layer and substrate, especially when the metal image obtained after exposure undergoes chemical processing and metallization.

Under the influence of activating radiation the photosensitive substance reacts with the metal at the irradiated areas thus destroying the catalytic activity of the metal layer, while in the non-irradiated areas the metal layer remains unchanged. In this way a direct positive image is built up, i.e. bright (transparent) at the irradiated areas and dark at the areas that have not been irradiated. After illumination, the unreacted photosensitive substance and the products of the photochemical reaction are removed by means of appropriate solvents, with the particular advantage of not disturbing metal in a non-irradiated area. The image thus formed on the thin metal layer can be intensified by selective deposition onto it of same or of some other metal by means of conventional physical development, chemical metallization (electroless plating) or electrolytic (galvanic) deposition.

The deposition of the thin metal layer over an appropriate carrier base having an intermediate adhesive surface can be effected by, for example, vacuum evaporation, cathode sputtering or chemical metallization. The metal layer is preferably deposited in a quantity of from $10^{-8}$ to $10^{-3}$ g/cm$^2$, preferably form $10^{-8}$ to $10^{-4}$ g/cm$^2$. The system has a maximum speed of reaction to light when it has ultra-thin, monoatomic layers which are invisible to the eye and consist of seperate submicroscopic metal nuclei. In this case, the visualization of the image obtained after exposure to irradiation requires the application of a carefully controlled, silver-containing physical developer. Thicker, very slightly visible, or even semi-transparent, metal films require correspondingly longer exposures to radiation, but in such cases the additional selective deposition of a metal by means of a conventional physical development, chemical metallization (electroless plating) or electrolytic deposition is much less intricate.

The metallic layer nearly always has a thickness not exceeding 5 thousandths of a millimeter, and usually not exceeding one thousandth of a millimeter depending on the state of the carrier surface and the chosen process of intensification.

The layer of photosensitive compound deposited over the metal layer and in direct contact with it can be applied by, for example, vacuum evaporation, cathode sputtering in an inert medium or a reactive medium, or by chemical precipitation. The photosensitive layer is usually applied in an amount from $10^{-6}$ to $10^{-3}$ g/cm$^2$, preferably about $10^{-4}$ g/cm$^2$. The optimum thickness of the photosensitive layer depends on the thickness of the metal layer and on the nature of the combination of the metal and photosensitive substance, and has to be empirically determined for each separate combination.

The intermediate adhesive layer which binds the substrate and thin metal layer can be formed by treating the substrate with an adhesive resin, etching solution or evaporated subbing layer.

Under the influence of the activating irradiation, a photochemical reaction occurs over the irradiated areas; the photo-activated photosensitive compound or photo-activated products of the photosensitive compound react with the metal, and the quantity of the metal reacting increases with the duration of the irradiation and with the intensity of the activating irradiation.

It was surprisingly established that, with appropriate combinations of photosensitive compounds and metals, the reaction proceeds at a constant rate during irradiation, almost independently of the quantity of the products formed as a result of the photochemical reaction. In such cases, it is possible to obtain complete photodecomposition of the photosensitive compounds, which normally appear as rather stable compounds. However, in the absence of the appropriate metal layer, required by the present invention, a stationary state is obtained on irradiation of such stable compounds, because the products of the photochemical decomposition react with each other and restore the initial condition of the photosensitive compound. On the other hand, in the presence of the suitable metal layer some photo-excited species of the photosensitive compound react with the metal irreversibly. It is because of this irreversible reaction that the stationary state cannot be established and the reaction proceeds until complete exhaustion of the preliminary deposited metal or until entire decomposition of the photosensitive compound is achieved.

An advantage of the photographic material of the present invention is that due to the presence of an intermediate adhesive layer, after irradiation the unreacted photosensitive compound and the products of the photochemical reaction can be removed by suitable common solvents, stabilizing in this way the image obtained against the action of further irradiation. Now, depending on the thickness of the initially deposited metal layer, the metal image obtained can be intensified by a conventional physical development, chemical metallization (electroless plating) or electrolytic deposition. Without such an intermediate adhesive layer, however, when dissolving the unreacted photosensitive compounds and the products of the photochemical reaction the image itself also strips off the substrate.

We have established that the sensitivity of the photographic material is substantially increased if, during production of the material, the metal layer and the layer of photosensitive substance are deposited immediately one after another by evaporation in vacuum. Obviously the intimate contact created by the vacuum deposition is an important factor which enhances the rate of the reaction between the metal and the photo-excited species of the photosensitive substance. This way of deposition has the additional advantage of making it possible to carry out the entire process for the preparation of the photographic material in a single technological cycle in vacuum, under conditions of high cleanliness. If desired and if necessary, this cycle may also include the exposure through a suitable transparency in order to form the positive image, thereby eliminating defects due to the presence of dust particles or to the influence of badly controlled side effects.

Another advantage is the wide variety of metals that can be used for the metal layer: silver, tin, lead, copper, antimony, molybdenum, bismuth, zinc, cadmium, iron, nickel, chromium, indium, or combinations of these, although preferably silver, tin, lead, copper, antimony or molybdenum are employed. There exist also large possibilities for the selection of the photosensitive compound, and use can even be made of compound which are usually considered rather stable and not normally capable of undergoing photochemical changes. The only necessary condition is that the photosensitive layer must be capable upon illumination of destroying the catalytic activity of the metal layer. A number of halides, halcognides and oxides are usable photosensitive compounds, as for example the halides of silver, cadmium, lead, bismuth, thallium, zinc, copper, mercury, the halcogenides or oxides of arsenic, lead, cadmium, zinc, antimony.

In those cases where it is necessary to prepare a photographic material with high resolution it is particularly useful to use the so-called vitreous (amorphous) halcogenide semiconductors such as $As_2S_x$, $As_2Se_x$, $As_2S_xI_y$, $As_2Se_xI_y$.

In those cases where it is necessary to prepare a photographic material sensitive over a wide spectral range it is possible to use compounds of combinations of some of the above mentioned compounds having photosensitivity in the corresponding region of the spectrum.

Any suitable carrier base can be employed in the preparation of photographic materials according to the present invention if provided with an appropriate intermediate adhesive layer. For example, there can be used carriers such as:

polyester film — for example "Melinex S" type, (product of Imperial Chemical Industries Ltd., Bessemer Road, Welwyn Garden City, Hertfordshire, England), which, in order to improve adhesion of the metal, can be coated with "Novoprint" resin, i.e., butadiene acrylonitrile rubber (a product of Shering A.G., 1 Berlin 65, Mullerstrasse 170–172, Germany), or with a polyvinylcinnamate based photoresist, for example "Copyrex RN40", (a product of Agfa-Gevaert A.G., 509 Leverkusen, Bayerwerk, Germany), or "Adcote 376", (product of Morton Williams Ltd., Hounslow, Middlesex, England) or "46971 Adhesive", (product of E.I. Du Pont de Nemours & Co., Inc., Wilmington, Delaware 19898, U.S.A.); or a polyacrylonitrile adhesive, for example such as Bondmaster 036-0103, product of Croda Polymers Ltd., Luton, U.K.; or thermoplastic buna (sodium butadiene) type adhesive, for example "Shipley Adhesive 200TF", product of Shipley Europe Ltd., Coventry, U.K.; or drafting film M5D50 (a product of Bexford Ltd., Manningtree, Essex, England), treated 3 to 5 min with 10% hydrofluoric acid; or subbed triacetate or polyester film (product of Bexford Ltd., Manningtree, Essex, England); or glass, on which a thin layer of magnesium fluoride or evaporated chromium 100A thick, has been deposited by evaporation in vacuum; or standard barite paper used in the photographic industry, as well as many other substrates, suitably subbed in order to improve the adhesion of the metal layer.

The following examples illustrate the present invention.

EXAMPLE 1

In turn, on each of the particular carriers specified above, silver was deposited by evaporation in conventional vacuum plant, working at about $5.10^{-5}$ torr, the silver being deposited from a Knudsen-type graphite crucible with a very small aperture, as described by Malinowski et al. in "Physica Status Solidi", 5, February 1964. The thickness of the metal deposited was measured with a film thickness monitor (produced by Edwards High Vacuum Ltd. of Manor Royal, Crawley, Sussex, England). At a temperature of about 1100° C controlled by a Pt/Pt-Rh thermocouple, there was deposited on the carrier held for 100 seconds at a distance of 15 cm from the crucible about $2.10^{-8}$ g/cm$^2$ of silver. This amount corresponded to less than a monoatomic layer and the metal nuclei formed on the carrier were invisible even with an electron microscope. A test treatment with the physical developer described below, however, shows that the silver nuclei formed catalysed substantially the deposition of silver on the carrier, which readily became black on processing. Immediately after the deposition of the silver nuclei, a layer of cadmium iodide was deposited. Since the thickness of the photosensitive layer required is usually larger than that of the metal, its evaporation from a Knudsen-type crucible is not recommended. Besides having larger opening—about 7 mm in diameter, in this case—the crucible used was placed nearer to the carrier, about 8 cm from the carrier. The thickness was again checked by the monitor. With the tantalum crucible containing the CdI$_2$ at 350° C., a layer of about $2.10^{-4}$ gm/cm$^2$ was deposited in five minutes.

The photographic material obtained in this way was exposed for 10 seconds to a collimated beam from a 100 Watt Xenon lamp, passed through a transparency. The photoactivated CdI$_2$ reacted with the silver nuclei on the irradiated areas of the material, while on the non-irradiated areas the metal nuclei remained intact, thus forming a latent direct positive image of the transparency. The unchanged cadmium iodide as well as the traces of silver iodide formed were removed by washing in water. The invisible silver nuclei which remained on the non-irradiated areas of the photographic material were intensified and the latent direct positive image formed was made visible by dipping the sample for 45 to 60 seconds into a physical developer having, in this case, the following composition:

| Solution A | |
|---|---|
| Metol | 8.3 g |

| -continued | |
|---|---|
| Citric acid | 8.3 g |
| Glacial acetic acid | 41.7 g |
| Gelatine | 6.7 g |
| Water up to | 1 liter |
| Solution B | |
| Silver nitrate | 30 g |
| Water | 45 ml |

Before use 50 parts of A were mixed with 1 part of B.

EXAMPLE 2

Using the apparatus described in Example 1 and following the same technique, about $1.10^{-7}$ g/cm$^2$ of silver was deposited on some of the substrates enumerated above. At a crucible temperature of 1200° C, this was achieved in from 1 to 2 minutes. Immediately after this, a layer of vitreous arsenous sulphide was deposited from a second, larger crucible, also as described in Example 1. In this case, at a crucible temperature of about 250° C. there was obtained after 30 seconds about $1.10^{-6}$ g/cm$^2$ of As$_2$S$_3$.

The photographic material obtained was exposed for 1 minute as described in Example 1. The unreacted As$_2$S$_3$ and the silver sulphide built up during the exposure were removed by treating the sample for 30 seconds in 0.1 n potassium hydroxide, thereby leaving invisible silver nuclei on the unexposed areas.

After abundant washing in water, the direct positive silver image was intensified for from 10 to 20 seconds in the physical developer given in Example 1.

Subsequent deposition of copper from the following bath created a well-conducting print of the transparency used:

| Solution A | |
|---|---|
| Copper sulphate (cryst.) | 35 g |
| Nickel sulphate | 5 g |
| Water up to | 500 ml |
| Solution B | |
| Sodium carbonate (desic.) | 35 g |
| Seignette salt | 190 g |
| Sodium hydroxide | 50 g |
| Water up to | 500 ml |

Before use, solutions A and B were mixed and to the resulting solution were added 10 ml ethyl alcohol and 30 ml 40% formaldehyde.

EXAMPLE 3

Following the technique described in Example 1, an invisible layer of tin nuclei were deposited on some of the substrate carriers enumerated above. At a temperature of 1400° C, from a graphite Knudsen-type crucible containing tin, after 1 minute there was obtained on the carrier about $1.10^{-7}$ g/cm$^2$ tin. Immediately after that a layer of CdI$_2$ was deposited as described in Example 1. After 1–2 minutes exposure, as described in Example 1, the sample was washed with water, leaving on the substrate an invisible direct positive image of the transparency, consisting of tin nuclei, which can be readily intensified as described in Example 1. Deposition of copper can also be achieved by firstly dipping the sample for from 5 to 10 seconds into the following solution:

| Palladium chloride | 0.25 g |
|---|---|
| Concentrated hydrochloric acid | 2.5 ml |

| | |
|---|---|
| -continued | |
| Water up to | 1 liter |

After abundant washing in running water, the palladium-activated tin nuclei were made visible by chemical metallization (electroless plating) with copper using the electroless plating bath "Noviganth G.S.", commercially available from Shering A.G., Galvanotechnik, West Berlin, or the bath described in Example 2, as well as that of the following composition:

| | |
|---|---|
| Copper sulphate (cryst.) | 34 g |
| Sodium salt of ethylenediamine tetraacetic acid | 100 g |
| Sodium hydroxide | 26 g |
| Water up to | 1 liter |

Before use, there were added to the above solution 400 ml 40% formaldehyde, and 350 ml 40% sodium hydroxide.

If the transparency used is of a printed circuit with suitably made connections, the metal image obtained after the chemical metallization (electroless plating) can be further thickened by the much faster and cheaper electrolytic deposition of copper. The electrolytic plating requires however a special design of the printed circuit providing interconnections of all metal parts, so that they can be easily connected with the cathode. If this is provided the electrolytic deposition of copper is successfully achieved, for example in the following solution:

| | |
|---|---|
| Copper sulphate (cryst.) | 50 g |
| Sodium hydroxide | 45 g |
| Potassium-sodium tartarate (Seignette salt) | 150 g |
| Water up to | 1 liter | at a current density of 0.5 a/dm$^2$ and temperature 25° C.

EXAMPLE 4

Tin was deposited by evaporation in vacuum as described in Example 2. Immediately afterwards a layer of lead iodide (about $1.10^{-4}$ g/cm$^2$) was deposited upon the tin layer. The lead iodide was evaporated for 5 minutes from a tantalum crucible at 380° C. The photographic material obtained in this way was exposed for 1–2 minutes to a Xenon lamp as described in Example 1. The exposed sample was treated with a 40% solution of potassium iodide which dissolved the unreacted lead iodide together with the products of the photochemical reaction and then was abundantly washed with water. The invisible positive metal image obtained was intensified by physical development as in Example 1 or, in the case of one sample, after activation with palladium, as described in Example 3. Electrolytic deposition of copper was also applied to one sample, as in Example 3.

EXAMPLE 5

On a polyester substrate was coated a 7 microns thick layer of the adhesive resin Bondmaster 036-0103. To ensure still better adhesion, the substrate was baked for about 40 min at 100° C, washed in pure tetrachloromethane and then loaded in the vacuum plant. Following the technique described in Example 1, about $1.10^{-7}$ g/cm$^2$ of silver was deposited, the carrier being kept at room temperature. A control treatment with the electroless copper bath described in Example 3 showed that the silver nuclei formed catalyze the deposition of copper on the substrate which readily becomed reddish. On top of the layer of silver nuclei a second layer of about $1.10^{-5}$ g/cm$^2$ arsenous sulfide was deposited from a tantalum crucible treated at a temperature of 300° C, the substrate being again kept at room temperature. The photographic material obtained in this way was exposed imagewise for 2 min through a transparency of a printed circuit to the beam of a 1000 W halogen lamp placed at a distance of 30 cm. This destroyed the catalytic activity of the silver nuclei on the illuminated areas, creating a direct positive image of the transparency used.

The photographic material was then treated for 5 to 10 sec in a 10% solution of NaOH, followed by an abundant washing under a water shower. If the product of the photochemical reaction could not be completely removed by the water shower, the sample was immersed for several seconds in a 10% solution of KCN.

After final rinsing in water, a tightly bound silver image remained on the substrate. To obtain the printed circuit, the image was intensifed by electroless and then by electrolytic copper deposition, following the technique described in Example 3.

EXAMPLE 6

To ensure the required adhesion, about 3 microns thick layer of the adhesive resin Shipley 200 TF was coated in a centrifuge on a finely polished and well cleaned glass substrate. Then $2.10^{-8}$ g/cm$^2$ of silver was deposited onto the carrier following the technique described in Example 1. Immediately after that a layer of $5.10^{-6}$–$5.10^{-5}$g/cm$^2$ arsenous sulfide was deposited as described in Example 5.

In this way a photographic material was obtained which was then exposed imagewise for 3 min to a beam of a halogen lamp, passing through an interference filter transmitting $\lambda \approx 436$ nm. Then the exposed material was treated to remove the products of the photochemical reaction as well as the unreacted arsenous sulfide. This was achieved by dipping the sample for 15 sec in a 5% solution of NaOH, then for 5 to 10 sec in a 10% solution of KCN. After abundant washing in deionized water, the direct positive image obtained was intensifed by dipping the sample for 75–90 sec in the physical developer described in Example 1.

The image has optical density from 1.5 to 2 as well as an extremely high resolution (lines 0.4 microns wide can be readily resolved) and can be used for producing photomasks for integrated circuits.

EXAMPLE 7

To ensure the required adhesion, a thin layer of about $2.10^{-8}$ g/cm$^2$ of chromium was vacuum evaporated onto a finely polished and well cleaned glass substrate. The evaporation was carried out at a rate of 5 A/sec from a tungsten boat heated at 1600° C and placed at a distance of 16 cm from the carrier. The chromium layer deposited has an optical density of 0.1. Further, the preparation of the photographic material and its processing was carried out as in Example 6.

It is claimed:

1. Photographic material yielding on exposure to radiation a direct positive image capable of being intensified by means of an additional deposition of a metal, comprising:

a. a nonmetallic, catalytically inactive carrier on the surface of which has been introduced an intermediate layer consisting of an adhesive resin or a vacuum evaporated magnesium fluoride or chromium which intermediate layer provides sufficient adhesion of the metal layer deposited onto it to withstand subsequent processing and intensification and to ensure mechanical stability of the latent image, said adhesive resin being selected from the group consisting of butadiene acrylonitrile rubber, polyvinylcinnamate, polyacrylonitrile, and thermoplastic sodium butadiene adhesive;

b. a metal layer of at least one catalytically active metal nuclei deposited on said intermediate layer and selected from the group consisting of silver, tin, lead, copper, antimony, molybdenum, bismuth, zinc, cadmium, iron, nickel, chromium, or indium or combination thereof capable of catalyzing the process of intensification by additional deposition of a metal, and having a thickness corresponding to $10^{-7}$ to $10^{-4}$ g/cm$^2$, empirically established for each metal and for the corresponding processing and intensification;

c. a layer of at least one photosensitive substance on said metal layer and selected from the group consisting of a halide of silver, cadmium, lead, bismuth, thallium, zinc, copper, or mercury; a chalcogenide (sulphide, selenide, telluride, or oxide) of arsenic, lead, cadmium, zinc, or antimony; a vitreous chalcogenide semiconductor of the type $As_2S_x$, $As_2S_3+S$, $As_2S_xI_y$, or $As_2Se_xI_y$, where $x$ has a value in the range from 1 to 7 and $y$ has a value in the range from 0.1 to 2, with a thickness corresponding to $10^{-6}$ to $10^{-3}$ g/cm$^2$, empirically matched with the thickness of the metal layer and the chosen intensification process, the said photosensitive substance being selected so that on image-wise exposure to radiation in any region exposed to radiation the catalytic activity of the said metal layer relative to the process of intensification is destroyed, but in any region not so exposed the said catalytic activity of the metal layer remains intact, so that after processing by selective dissolution the direct positive metal image obtained is capable of catalyzing the selective deposition onto it of the same metal or another metal providig thereby an intensification of the primary image.

2. A process for producing a direct positive image which comprises:

a. exposing imagewise to radiation the photographic material as claimed in claim 1;

b. removing the photosensitive substance on the non-illuminated regions and the metal layer having a destroyed catalytic activity on the illuminated regions by means of a solvent, thereby obtaining a direct positive latent metal image, which is stable against further irradiation and adheres to the intermediate layer of the substrate so that the image can withstand the process of intensification by means of an additional deposition of a metal;

c. intensifying the direct positive image obtained by the selective deposition onto it of the same or another metal by means of physical development or electrolytic deposition or a combination thereof.

* * * * *